United States Patent
Peckham et al.

(10) Patent No.: US 6,674,333 B1
(45) Date of Patent: Jan. 6, 2004

(54) BAND SWITCHABLE VOLTAGE CONTROLLED OSCILLATOR WITH SUBSTANTIALLY CONSTANT TUNING RANGE

(75) Inventors: David S. Peckham, Barrington Hills, IL (US); Arul M. Balasubramaniyan, Round Lake, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/271,828

(22) Filed: Oct. 15, 2002

(51) Int. Cl.$^7$ .................................................. H03B 5/00
(52) U.S. Cl. ................... 331/36 C; 331/177 V; 331/179; 331/117 R
(58) Field of Search .................. 331/177 V, 179, 331/117 R, 36 C; 455/264

(56) References Cited

U.S. PATENT DOCUMENTS

| | | | |
|---|---|---|---|
| 3,813,615 A | 5/1974 | Okazaki | 331/109 |
| 3,825,858 A | 7/1974 | Amemiya et al. | 331/117 R |
| 3,866,138 A | 2/1975 | Putzer et al. | 331/60 |
| 5,493,715 A * | 2/1996 | Humphreys et al. | 455/264 |
| 6,133,797 A | 10/2000 | Lovelace et al. | 331/17 |
| 6,304,146 B1 | 10/2001 | Welland | 331/2 |
| 6,407,412 B1 | 6/2002 | Iniewski et al. | 257/107 |

* cited by examiner

Primary Examiner—Arnold Kinkead
(74) Attorney, Agent, or Firm—Fulbright & Jaworski, LLP (57) ABSTRACT

Systems and methods are described for a band switchable voltage controlled oscillator. A method comprises: operating said voltage controlled oscillator in a first frequency band by switching a first capacitive circuit having a capacitance that varies with a tuning voltage; and operating said voltage controlled oscillator in a second frequency band by switching a second capacitive circuit having a capacitance that does not vary with the tuning voltage. An apparatus comprises: a switchable variable capacitance circuit; a switchable fixed capacitance circuit coupled to the switchable variable capacitance circuit; a controller for selectively switching said switchable fixed and variable capacitance circuits; a fixed tank capacitance circuit coupled to the switchable fixed capacitance circuit; a main tuning voltage variable capacitance circuit coupled to the fixed tank capacitance circuit; a tank inductance coupled to the main tuning voltage variable capacitance circuit; and an amplifier circuit coupled to the tank inductance.

17 Claims, 8 Drawing Sheets

BAND SWITCHABLE VOLTAGE CONTROLLED OSCILLATOR WITH SUBSTANTIALLY CONSTANT TUNING RANGE

BACKGROUND OF THE INVENTION

1. Field of the Invention

The invention relates generally to the field of oscillators. More particularly, the invention relates to voltage controlled oscillators.

2. Discussion of the Related Art

A voltage-controlled oscillator (VCO) is a circuit that generates an oscillating signal at a frequency proportional to an externally applied control voltage. These types of circuits find several applications in telecommunications, and are useful for tracking and matching signal frequencies as they shift due to thermal variations, power supply fluctuations, and other sources of frequency shifts.

Modern electronics often require a VCO to operate over large frequency ranges. Nevertheless, increasing the tuning bandwidth often degrades the signal-to-noise ratio (SNR) of the VCO's output. While multi-band products can use multiple VCO's for multiple frequency ranges, this adds to chip area and require undesirable switching of signal paths.

U.S. Pat. No. 3,813,615 to Okazaki describes an oscillator circuit suitable to operate at low and high band frequencies by switching of an inductance. While an inductance switching VCO may tend to keep a constant tuning range, it is not practical given current integrated circuit (IC) technology.

Capacitance can be switched by changing the voltage across a tuning element such as a voltage variable capacitor (VVC). Nevertheless, the more capacitance is switched in for operation in lower frequency ranges, the more the tuning range decreases. Thus, compromises have to be made between tuning tolerance on the low range and noise on the high range.

Until now, the requirements of providing a method and/or apparatus for a band switched voltage controlled oscillator with constant tuning range that is suitable for use with current IC technology have not been met.

SUMMARY OF THE INVENTION

There is a need for the following embodiments. Of course, the invention is not limited to these embodiments.

According to an aspect of the invention, a method for operating a band switchable voltage controlled oscillator in at least two different frequency bands of substantially equal bandwidth comprises: operating said voltage controlled oscillator in a first frequency band by switching a first capacitive circuit having a capacitance that varies with a tuning voltage; and operating said voltage controlled oscillator in a second frequency band by switching a second capacitive circuit having a capacitance that does not vary with the tuning voltage. According to another aspect of the invention, a band switchable voltage controlled oscillator, comprises: a switchable variable capacitance circuit; a switchable fixed capacitance circuit coupled to the switchable variable capacitance circuit; a controller for selectively switching said switchable fixed and variable capacitance circuits; a fixed tank capacitance circuit coupled to the switchable fixed capacitance circuit; a main tuning voltage variable capacitance circuit coupled to the fixed tank capacitance circuit; a tank inductance coupled to the main tuning voltage variable capacitance circuit; and an amplifier circuit coupled to the tank inductance.

These, and other, embodiments of the invention will be better appreciated and understood when considered in conjunction with the following description and the accompanying drawings. It should be understood, however, that the following description, while indicating various embodiments of the invention and numerous specific details thereof, is given by way of illustration and not of limitation. Many substitutions, modifications, additions and/or rearrangements may be made within the scope of the invention without departing from the spirit thereof, and the invention includes all such substitutions, modifications, additions and/or rearrangements.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore nonlimiting, embodiments illustrated in the drawings, wherein like reference numerals (if they occur in more than one view) designate the same elements. The invention may be better understood by reference to one or more of these drawings in combination with the description presented herein. It should be noted that the features illustrated in the drawings are not necessarily drawn to scale.

DETAILED DESCRIPTION

The invention and the various features and advantageous details thereof are explained more fully with reference to the nonlimiting embodiments that are illustrated in the accompanying drawings and detailed in the following description. It should be understood that the detailed description, while indicating specific embodiments of the invention, is given by way of illustration only and not by way of limitation. Various substitutions, modifications, additions and/or rearrangements within the spirit and/or scope of the underlying inventive concept will become apparent to one of ordinary skill in the art in light of this disclosure.

Figure 1:
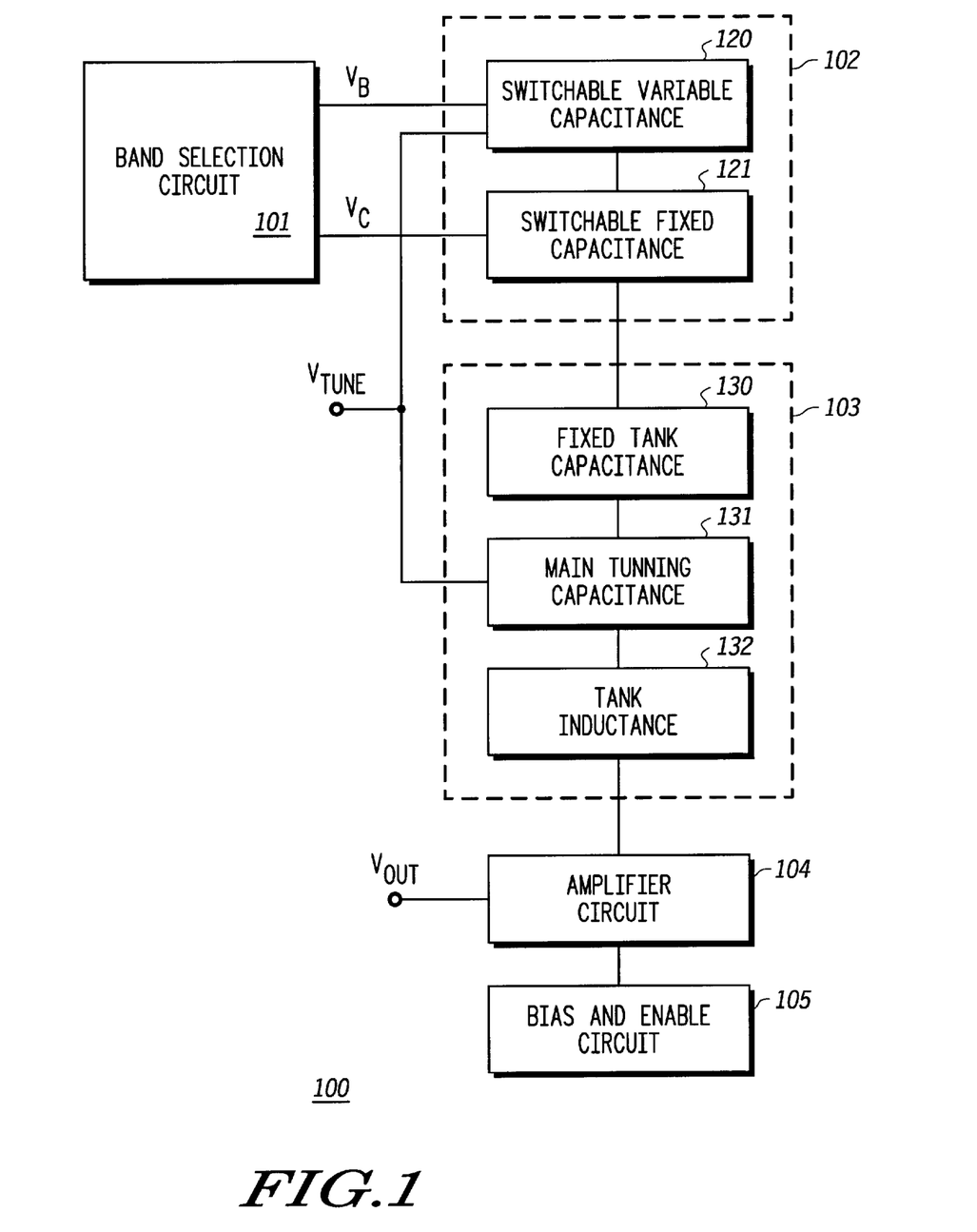
FIG. 1 is a block diagram of a band switchable voltage controlled oscillator, representing an embodiment of the invention.

Referring to FIG. 1, a block diagram of a band switchable voltage controlled oscillator 100 is presented in accordance with an exemplary embodiment of the invention. A band selection circuit 101 is coupled to a band switchable circuit 102. The band switchable circuit 102 is coupled to a tank circuit 103. The tank circuit 103 is coupled to an amplifier circuit 104. The amplifier circuit 104 is coupled to a bias circuit 105. The bias circuit 105 may enable operation of the voltage controlled oscillator 100.

Still referring to FIG. 1, in the illustrated embodiment, the band switchable circuit 102 comprises a switchable variable capacitance circuit 120 coupled to a switchable fixed capacitance circuit 121. The band selection circuit 101 provides a first band control voltage $V_B$ to the switchable variable capacitance circuit 120 and a second control voltage $V_C$ to the switchable fixed capacitance circuit 121. The tank circuit 103 comprises a fixed tank capacitance 130 coupled to a main tuning capacitance 131. The tank circuit 103 also comprises a tank inductance 132 coupled to the main tuning capacitance 131.

Still referring to FIG. 1, a tuning voltage (Vtune) is applied to the switchable fixed capacitance circuit 121 and to the main tuning capacitance 131. The tuning voltage (Vtune) may tune the tank circuit 103 and determine the frequency of an output voltage (Vout). The tank circuit 103 has the ability to store energy and produce a continuous alternating current output. The output voltage (Vout) may be differentially probed in the amplifier circuit 104.

Still referring to FIG. 1, the band selection circuit 101 determines the band of operation of the VCO 100 by applying complementary control voltages $V_C$ and $V_B$ to the band switchable circuit 102. According to one aspect of the invention, the bandwidth of the band of operation is proportional to ratio between fixed and variable capacitances within band switchable circuit 102 and tank circuit 103. The band switchable circuit 102 comprises a combination of variable and fixed capacitances which may be switched in and out of the circuit to change the band of operation of the VCO 100 while minimizing and/or eliminating tuning range variations among the different bands. In FIG. 1 and in all circuit block diagrams and schematics in the present disclosure, wires connected by dots indicate an electrical connection. Crossing wires without dots in their intersection are not electrically connected.

Figure 2:
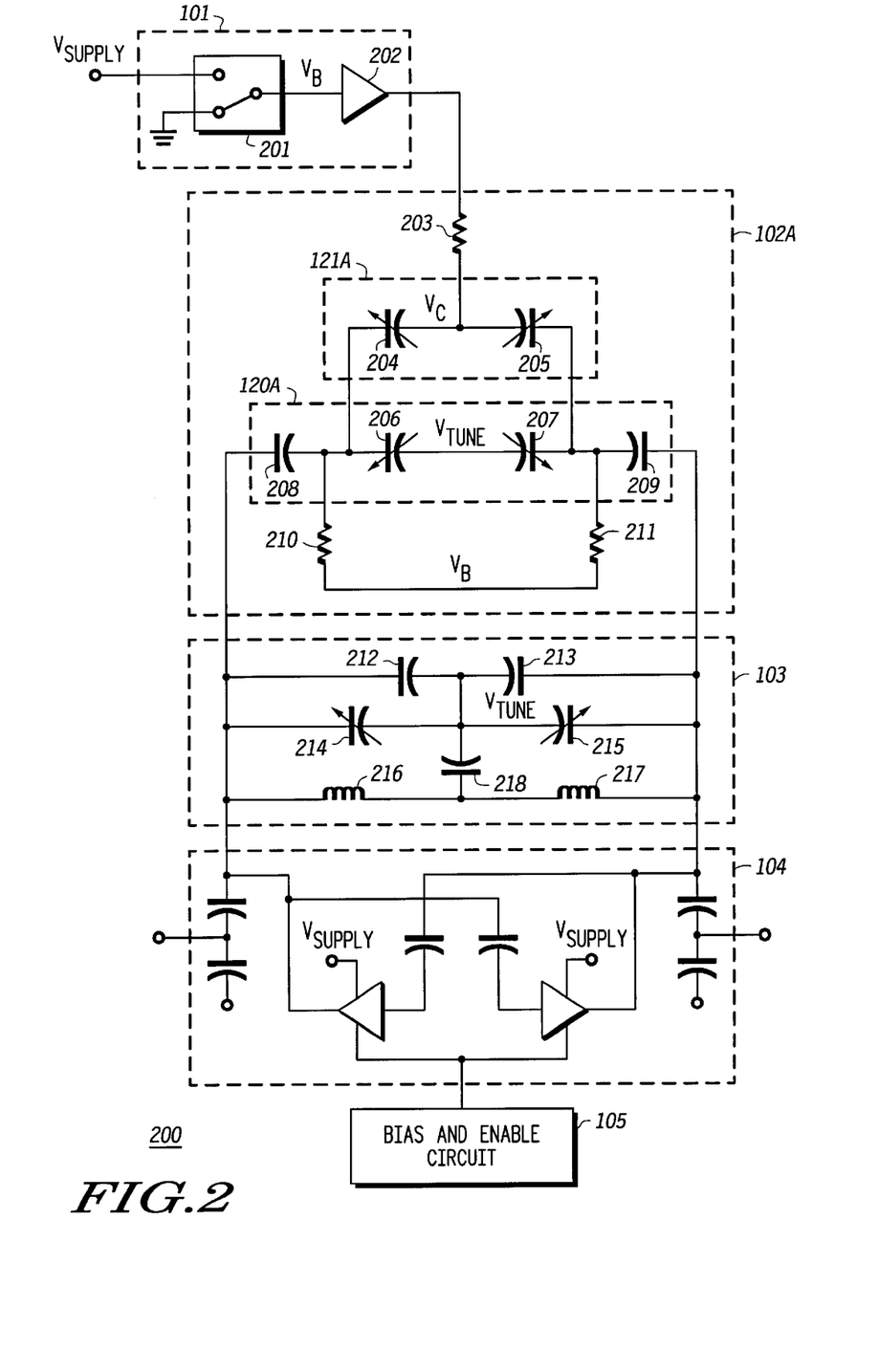
FIG. 2 is a circuit diagram of a first dual-band, band-switchable voltage controlled oscillator, representing an embodiment of the invention.

Referring to FIG. 2, a circuit diagram of a first dual-band, band-switchable voltage controlled oscillator 200 is depicted according to one aspect of the invention. The band selection circuit 101 comprises a switch 201 and an inverting amplifier 202. The band switched circuit 102A includes a switchable variable capacitance circuit 120A and a switchable fixed capacitance circuit 121A. Capacitors 204–207 are voltage variable capacitors (VVCs), such as, for example, MOS capacitors, and capacitors 208 and 209 are fixed value capacitors, such as, for example, metal-insulator-metal capacitors (MIMs). In the tank circuit 103, a main tuning capacitance comprises a pair of VVCs 214, 215, while the fixed tank capacitance comprises a pair of MIMs 212, 213 and the tank inductance comprises a pair of inductors 216, 217. A capacitor 218 serves as an AC coupling in the tank circuit 103. In operation the combined capacitance within band-switched circuit 102A and tank circuit 103 together determine the oscillation frequency of VCO 200.

Still referring to FIG. 2, the switch 201 produces a control voltage $V_B$ which takes one of two logic states, a reference voltage or ground. The output of the switch 210 is fed to a node between resistors 210, 211 and to the input of inverting amplifier 202. The inverting amplifier 202 feeds the complement of $V_B$, i.e. $V_C$, to the band switchable circuit 102A via a resistor 203. A tuning voltage (Vtune) is applied to a node between capacitors 206, 207, and to a node between capacitors 214, 215, determining the frequency output of the VCO. The VCO 200 output oscillates at a frequency proportional to Vtune.

Still referring to FIG. 2, while the capacitances of capacitors 206, 207 vary proportionally to Vtune, capacitors 204, 205 assume two distinct capacitance values. When the control voltage $V_B$ is at a high logic state, the control voltage $V_C$ is at low logic state and the VCO 200 operates in a low frequency band. In this low frequency band, capacitors 206, 207 may be tuned by Vtune and the capacitances of 204, 205 assume high capacitance values. In this low frequency band, Vtune is used to tune capacitors 206, 207 as well as capacitors 214, 215 within the main tuning capacitance 131 of the tank circuit 103. When the control voltage $V_B$ is at a low logic state, the control voltage $V_C$ is at high logic state and the VCO 200 operates in a high frequency band. In this high frequency band, capacitors 206, 207 cannot be tuned by Vtune and become substantially fixed value capacitors, while and the capacitances of 204, 205 assume substantially fixed low capacitance values. In this high frequency band, Vtune is used to tune only capacitors 214, 215 within the main tuning capacitance 131 of the tank circuit 103. In accordance with one aspect of the present invention, the ratio of fixed capacitance to variable capacitance within band switched circuit 102A and tank circuit 103 remains substantially constant regardless of the state of control voltages $V_B$ and $V_C$. This results in VCO 200 having two substantially constant oscillation bandwidths.

Figure 3:
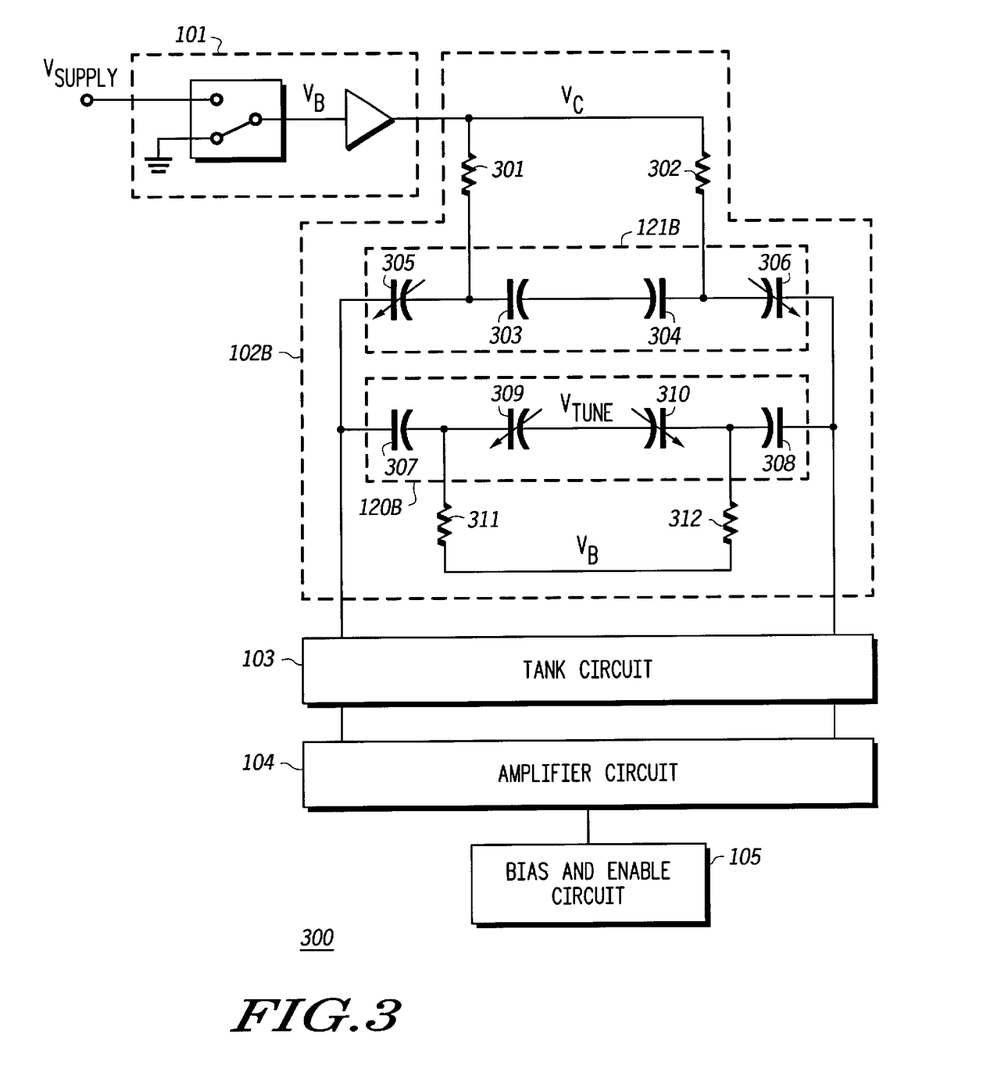
FIG. 3 is a circuit diagram of a second dual band, band-switchable voltage controlled oscillator, representing another embodiment of the invention.

Referring to FIG. 3, a circuit diagram of a second dual band, band-switchable voltage controlled oscillator 300 is depicted according to one aspect of the invention. The band switched circuit 102B includes a switchable variable capacitance circuit 120B and a switchable fixed capacitance circuit 121B. Capacitors 305, 306, 309, 310 are voltage variable capacitors and capacitors 303, 304, 307, 308 are fixed value capacitors. In this embodiment, when the control voltage $V_B$ is at a high logic level ($V_C$ is low), capacitors 309, 310 may be tuned by Vtune, capacitors 305, 306 assume a substantially fixed high capacitance state and the VCO 300 operates in a low frequency band. When the control voltage $V_C$ is at a high logic level ($V_B$ is low), capacitors 309, 310 cannot be tuned by Vtune and become substantially fixed value capacitors, while and capacitors 305, 306 assume a substantially low capacitance state and the VCO 300 operates in a high frequency band. As in FIG. 2 and in accordance with one aspect of the present invention, the ratio of fixed capacitance to variable capacitance within band switched circuit 102B and tank circuit 103 remains substantially constant regardless of the state of control voltages $V_B$ and $V_C$. This results in VCO 300 having two substantially constant oscillation bandwidths.

Figure 4:
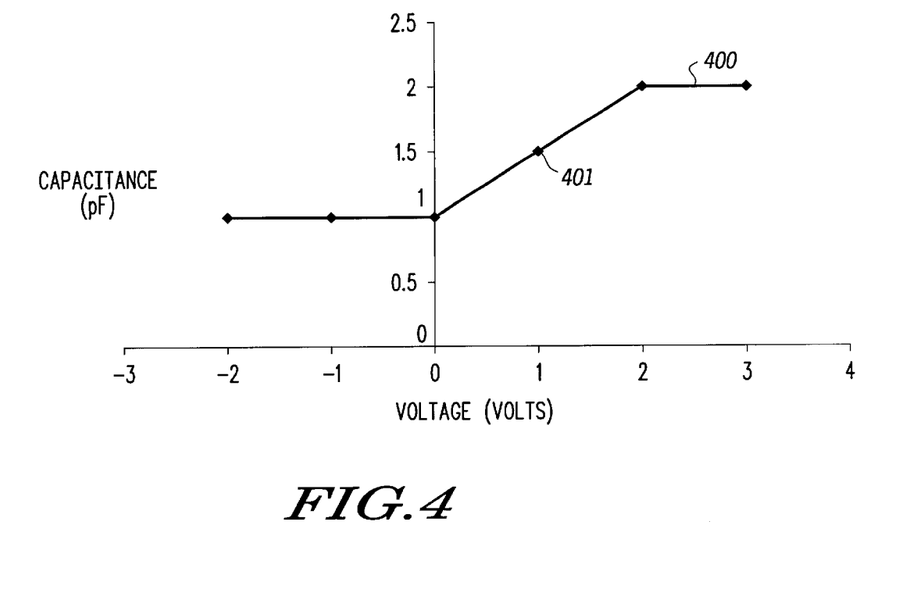
FIG. 4 is a simplified graph of capacitance versus voltage, illustrating an embodiment of the invention.

Referring to FIG. 4, a simplified piece-wise linear graph of capacitance versus voltage across a VVC is depicted, illustrating an aspect of the invention. Curve 400 shows how the capacitance of a VVC in the band switchable circuits 102A and 102B of FIGS. 2 and 3, respectively, may vary as a function of the voltage across it (C-V curve). The voltage across the VVC may be a function of Vtune.

Referring to FIGS. 2 and 4, the operation of capacitors 204, 205 and 206, 207 is illustrated in Table I.

TABLE I

Operation of VVCs detailed in FIG. 2

| | | Voltage (volts) | | Capacitance (picoFarad) | |
|---|---|---|---|---|---|
| | | 204, | | | |
| $V_C$ | $V_B$ | 205 | 206, 207 | 204, 205 | 206, 207 |
| Low Band 0 | 2.5 | 2.5 | 1 [+/−1.5] | 2 | 1.5 +/− 0.5 |
| High Band 2.5 | 0 | −2.5 | −1.5 [+/−1.5] | 1 | 1 |

When the VCO 200 is operating in a low band ($V_B$ is high and $V_C$ is low), the voltage across each of capacitors 204, 205 is 2.5 volts and they are substantially fixed with a 2 pF capacitance value. For capacitors 206, 207, as Vtune varies between 0 and 3 Volts, the voltage applied across capacitors 206 and 207 varies between 2.5 and −0.5 Volts and their capacitances may vary between 1 and 2 pF, i.e. operation is centered around point 401 of curve 400. When the VCO 200 is operating in a high band ($V_B$ is low and $V_C$ is high), the voltage across each of capacitors 204, 205 is −2.5 volts and they are substantially fixed with a 1 pF capacitance value. Capacitors 206, 207 cannot be tuned by Vtune and are also substantially fixed with a 1 pF capacitance value.

Referring to FIGS. 3 and 4, the operation of capacitors 305, 306 and 309, 310 is illustrated in Table II.

TABLE II

Operation of VVCs detailed in FIG. 3

| | | Voltage (volts) | | Capacitance (picoFarad) | |
|---|---|---|---|---|---|
| | | 305, | | | |
| $V_C$ | $V_B$ | 306 | 309, 310 | 305, 306 | 309, 310 |
| Low Band 0 | 2.5 | 2.5 | 1 [+/−1.5] | 2 | 1.5 +/− 0.5 |
| High Band 2.5 | 0 | 0 | −1.5 [+/−1.5] | 1 | 1 |

When the VCO 300 is operating in a low band ($V_B$ is high and $V_C$ is low), the voltage across each of capacitors 305, 306 is 2.5 volts and they are substantially fixed with a 2 pF capacitance value. For capacitors 309, 310, as Vtune varies between 0 and 3 Volts, the voltage applied across capacitors 309 and 310 varies between 2.5 and −0.5 Volts and their capacitances may vary between 1 and 2 pF, i.e., operation is centered around point 401 of curve 400. When the VCO 300 is operating in a high band ($V_B$ is low and $V_C$ is high), the voltage across each of capacitors 305, 306 is 0 volts and they are substantially fixed with a 1 pF capacitance value. In this state, capacitors 309, 310 cannot be tuned by Vtune and are substantially fixed with a 1 pF capacitance value.

As one of ordinary skill in. the art will recognize in light of this disclosure, while the circuits detailed in FIGS. 2 and 3 may provide similar functionality, the selection of a particular topology may depend on several factors, including the reference and tune voltages available, the type of variable element, and the layout.

Figure 5:
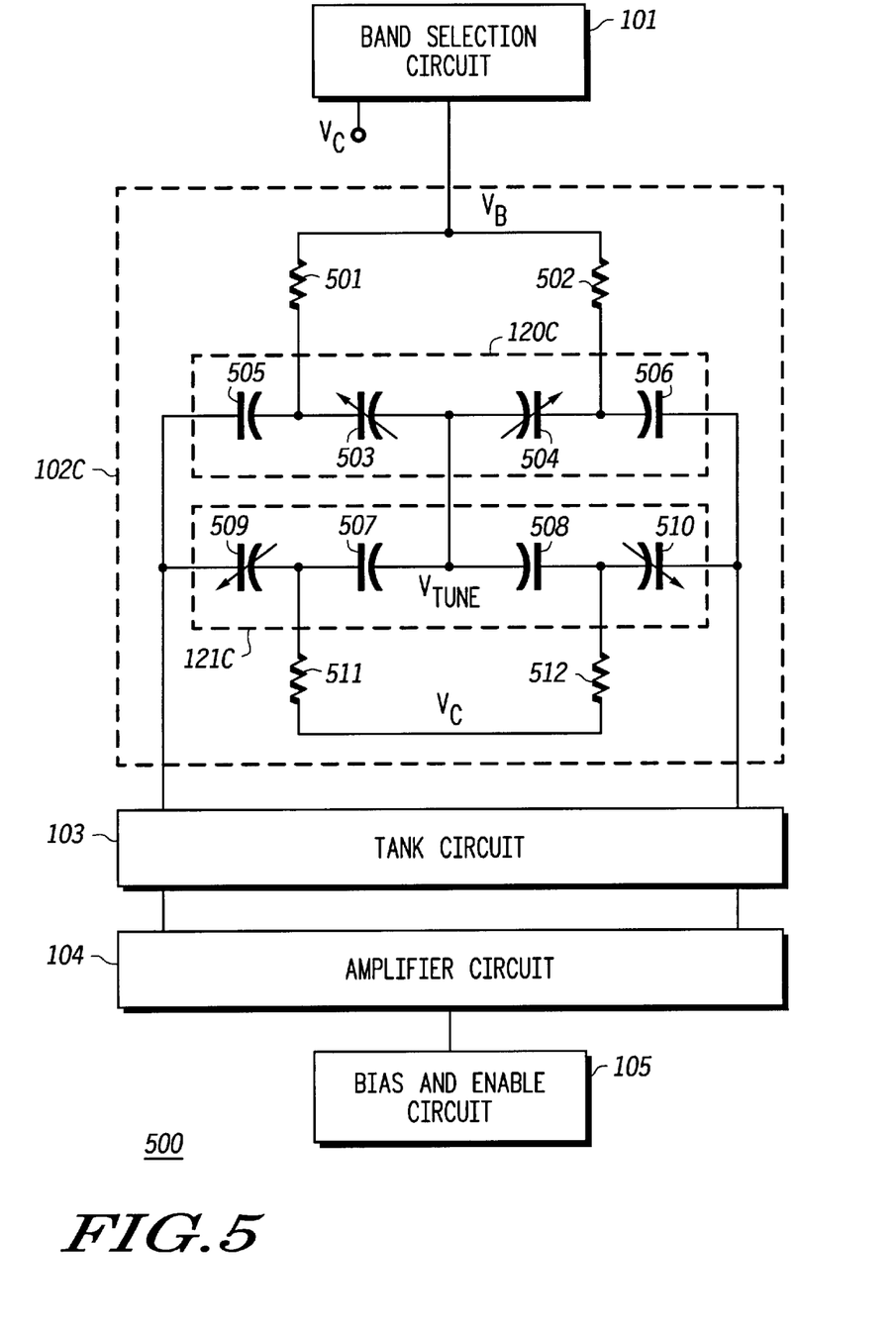
FIG. 5 is a circuit diagram of a third dual-band, band switchable voltage controlled oscillator, representing an embodiment of the invention.

Referring to FIG. 5, a circuit diagram of a third dual-band, band switchable voltage controlled oscillator 500 is depicted according to an aspect of the invention. The band switched circuit 102C includes a switchable variable capacitance circuit 120C and a switchable fixed capacitance circuit 121C. Capacitors 503, 504, 509, 510 are voltage variable capacitors and capacitors 505–508 are fixed value capacitors. When the VCO 500 is to operate in a low frequency band, the control voltage $V_B$ assumes a high state ($V_C$ is low) and it is applied to the switchable variable capacitance circuit 120C via a pair of resistors 501, 502, and a tuning voltage may be applied to a node between capacitors 507, 508 and 503, 504. When the VCO 500 is to operate in a high frequency band, control voltage $V_C$ assumes a high state ($V_B$ is low) and it is applied to the switchable fixed capacitance circuit 121C via a pair of resistors 511, 512. In this high frequency band, capacitors 503, 504 are essentially fixed value capacitors. As in FIGS. 2 and 3, the ratio of fixed capacitance to variable capacitance within band switched circuit 102C and tank circuit 103 remains substantially constant regardless of the state of control voltages $V_B$ and $V_C$. This results in VCO 500 having two substantially constant oscillation bandwidths Still referring to FIG. 5, circuit element values may be chosen to provide a desired band shift and tuning range for each band. For a given value of tank inductance 132 (FIG. 1), a main tuning capacitance 131 and a fixed tank capacitance 130 may be selected to cover an upper band range. A center frequency F of a band of operation may be:

$$F = \frac{1}{\sqrt{2\pi LC}};$$

where L is the equivalent inductance and C is the equivalent capacitance of the band switchable circuit 102 and tank circuit 103 of the VCO 500.

For example, with Vtune at 0.5 volts and a target oscillation (center frequency) of F=3.22 Ghz, values for inductance and capacitance are L=390 pH and C=6.26 pF, respectively. For the low band, in order to arrive at a new target of 3.02 Ghz (with Vtune still at 0.5V), the capacitance increases to 7.12 pF total. The fixed and variable capacitances have a low capacitance when $V_B$ is low and a high capacitance when $V_B$ is high, and a ratio of high to low capacitance is of about 2. Thus, the overall band switch capacitance may be increased by about 2 times the 0.86 pf difference in order to establish the required bandshift. The main tuning capacitance 131 may be designed taking the minimum band switch capacitance into account in order for the VCO 500 to stay at the upper band frequencies.

Still referring to FIG. 5, in order to maximize the effectiveness of the VVC pair 503, 504, their series MIM capacitors 505, 506 may be chosen to be approximately twice the maximum VVC value. For the same reason, fixed value capacitors 507, 508 may be chosen to have about twice the capacitance of VVCs 509, 510. In one embodiment, the desired ratio of total variable to fixed capacitance remains the same for each band and the VCO 500 maintains a substantially constant center frequency and bandwidth for each band.

Still referring to FIG. 5, according to one aspect of the invention, adjustments to the switchable fixed and variable capacitances 121C, 120C may be made to center each band with the desired bandwidth by observing that increasing either switchable fixed 121C or switchable variable capacitance 120C can increase the band shift and lower the low band of operation. Also, increasing the switchable fixed capacitance 121C can decrease the low band bandwidth. Further, increasing the switchable variable capacitance 120C can increase the low band bandwidth.

Figure 6:
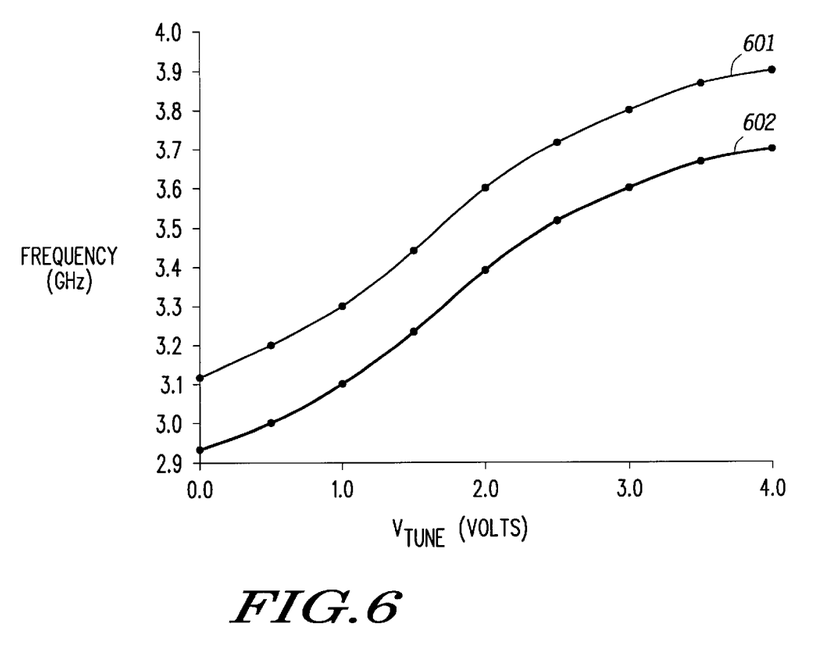
FIG. 6 is a graph of a simulated dual-band, band switchable voltage controlled oscillator circuit output, illustrating an embodiment of the invention.

Referring to FIG. 6, a graph of the simulated dual-band, band switchable voltage controlled oscillator circuit output detailed in FIG. 5 is depicted illustrating an embodiment of the invention. The vertical axis is the frequency output of the VCO 500 in GHz, and the horizontal axis is the tuning voltage Vtune in volts. Plots 601 and 602 respectively show tuning curves for a higher and a lower band of operation of the VCO 500. The results are summarized as illustrated in Table III.

TABLE III

Summary of Results for Dual-Band VCO

| | 0.5–3 V tuning range | Bandwidth | Bandshift (low/high) | overall range |
|---|---|---|---|---|
| High Band | 3.22–3.82 GHz | 600 MHz | — | — |
| Low Band | 3.02–3.58 GHz | 560 MHz | 200/240 MHz | 800 Mhz |

In Table III, the bandshift column indicates the change in frequency from the lowest frequency of the low band to the lowest frequency of the high band, and the change in frequency from the high frequency of the low band to the high frequency of the high band.

Still referring to FIG. 6, the 0.5–3V tuning range can be read on the horizontal axis, while the bandwidth, band shift and overall range can be read from the vertical axis. For the lower range (low band), the VCO 500 has substantially the same bandwidth as the upper band.

As one of ordinary skill in the art will recognize in light of this disclosure, additional pairs of switched fixed and variable capacitance circuits may be added to the circuit in order to obtain constant bandwidth within more bands. The invention can include and N-band switched voltage controlled oscillator with constant tuning range, where N is an integer greater than 1.

Figure 7:
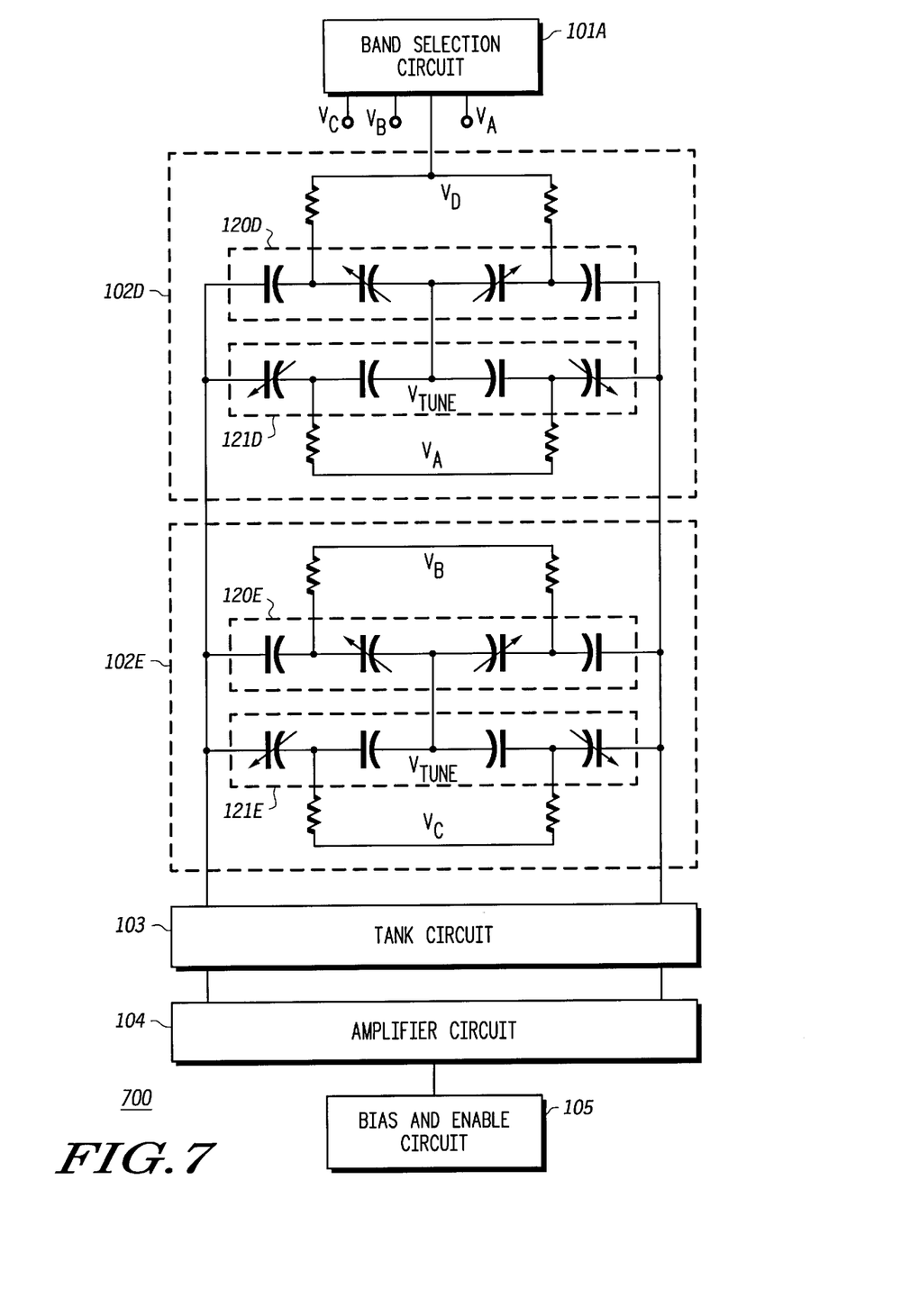
FIG. 7 is a circuit diagram of a multi-band, band switchable voltage controlled oscillator, representing an embodiment of the invention.

Referring to FIG. 7, circuit diagram of a multi-band, band switchable voltage controlled oscillator 700 is depicted, representing an embodiment of the invention. The design of the three-band voltage controlled oscillator is similar to the one described for the dual-band circuit detailed above. A first band switchable circuit 102D includes first switchable variable and fixed capacitances 120D, 121D and it is coupled to a second band switchable circuit 102E. The second band switchable circuit 102E, includes second switchable variable and fixed capacitances 120E, 121E.

Still referring to FIG. 7, a first pair of control voltages $V_D$, $V_A$, may be applied to the first band switchable circuit 102E, and a second pair of voltages $V_B$, $V_C$ may be applied to the second band switchable circuit 102E. These voltages are generated by a the control circuit 101A. The VCO 700 can produce an output frequency with substantially constant bandwidth in up to four different frequency bands. In one embodiment, the VCO 700 may be designed to operate in three different frequency bands. Once again, and in accordance with one aspect of the present invention, the ratio of fixed capacitance to variable capacitance within band switched circuits 102D and 102E and tank circuit 103 remains substantially constant regardless of the state of control voltages $V_A$, $V_B$, $V_C$ and $V_D$. This results in VCO 700 having three substantially constant oscillation bandwidths.

Figure 8:
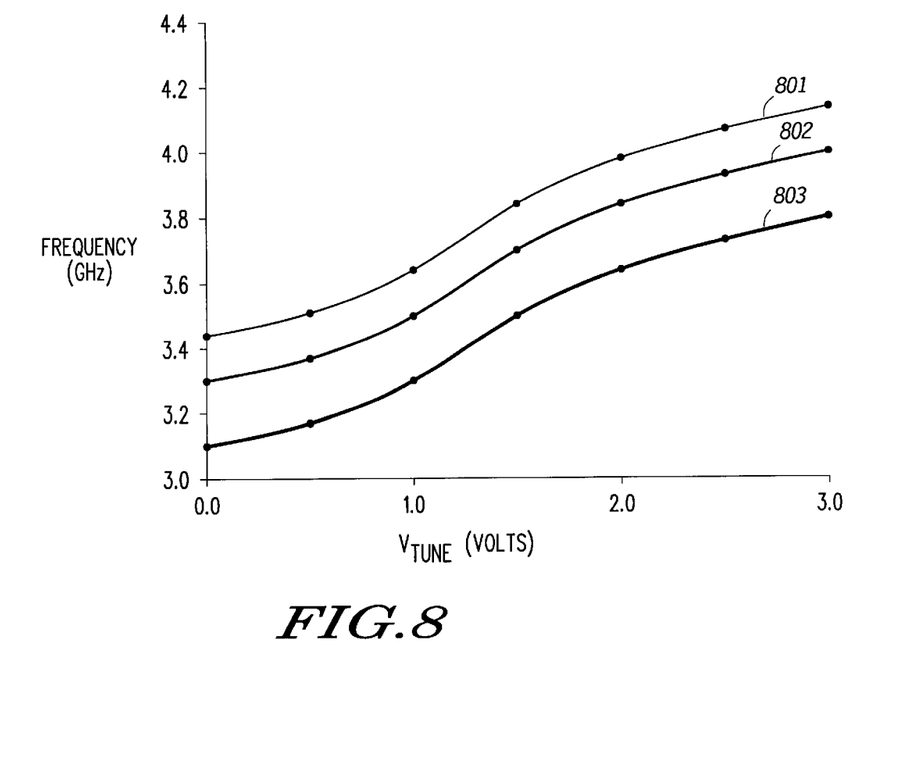
FIG. 8 is a graph of a simulated multi-band, band switchable voltage controlled oscillator output, illustrating an embodiment of the invention.

Referring to FIG. 8, a graph of the simulated multi-band, band switchable voltage controlled oscillator output detailed in FIG. 7 is depicted illustrating an embodiment of the invention. The vertical axis is the frequency output of the. VCO 700 in GHz, while the horizontal axis is the tuning voltage Vtune in volts. Plots 801, 802, and 803 show tuning curves for a high, mid, and low bands of operation of the VCO 700, respectively. A set of results are summarized as illustrated in Table IV.

TABLE IV

Summary of Results for Three-Band VCO

| | 0.5–3 V tuning range | Bandwidth | Bandshift (low/high) |
|---|---|---|---|
| High band | 3.55–4.22 GHz | 670 MHz | — |
| Mid band | 3.41–4.06 GHz | 650 MHz | 140/160 MHz |
| Low band | 3.18–3.82 GHz | 640 MHz | 230/240 MHz |

In Table IV, as in Table III, the bandshift column indicates the differences between the lowest frequencies of the three bands and the differences between the highest frequencies of each of the three bands.

Still referring to FIG. 8, the 0.5–3V tuning range can be read on the horizontal axis, while the bandwidth, band shift and overall range can be read from the vertical axis. As may be seen with reference to FIG. 8, the bandwidths for the upper range (high band), middle range (mid band), and low range (low band) are substantially equal.

According to one embodiment of the invention, a tuning circuit, a band shift inverting circuit, and/or a bias and enable circuit may be used to provide operational voltages and/or controls to a band switchable voltage controlled oscillator. The tuning circuit may provide a tuning voltage Vtune. A band shift inverting circuit may provide a first selection voltage $V_B$ and a second selection voltage $V_C$. Another band shift inverting circuit may provide a third control voltage $V_A$ and a fourth control voltage $V_D$. As one of ordinary skill in the art will recognize in light of this disclosure, such circuits may assume a variety of forms known in the art.

The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically. The term substantially, as used herein, is defined as at least approaching a given state.

Further, although the band switched voltage controlled oscillator with substantially constant tuning range described herein can be a separate module, it will be manifest that the band switched voltage controlled oscillator with constant tuning range may be integrated into the system with which it is associated. Furthermore, all the disclosed elements and features of each disclosed embodiment can be combined with, or substituted for, the disclosed elements and features of every other disclosed embodiment except where such elements or features are mutually exclusive.

The appended claims are not to be interpreted as including means-plus-function limitations, unless such a limitation is explicitly recited in a given claim using the phrase(s) "means for" and/or "step for." Subgeneric embodiments of the invention are delineated by the appended independent claims and their equivalents. Specific embodiments of the invention are differentiated by the appended dependent claims and their equivalents.

What is claimed is:

1. A method for operating a band switchable voltage controlled oscillator in at least two different frequency bands of substantially equal bandwidth, comprising:

operating said voltage controlled oscillator in a first frequency band by switching a first capacitive circuit having a capacitance that varies with a tuning voltage; and operating said voltage controlled oscillator in a second frequency band by switching a second capacitive circuit having a capacitance that does not vary with the tuning voltage, a ratio of total variable to fixed capacitance being substantially equal for said first and second frequency bands.

2. The method of claim 1, further comprising tuning said voltage controlled oscillator within said first frequency band.

3. The method of claim 1, further comprising tuning said voltage controlled oscillator within said second frequency band.

4. The method of claim 1, further comprising increasing a capacitance of the first capacitive circuit to increase a band shift.

5. The method of claim 4, wherein increasing the band shift includes lowering a low band.

6. The method of claim 4, wherein increasing the capacitance of the first capacitive circuit includes increasing a low band bandwidth.

7. The method of claim 1, further comprising increasing a capacitance of the second capacitive circuit to increase a band shift.

8. The method of claim 7, wherein increasing the band shift includes lowering a low band.

9. The method of claim 7, wherein increasing the capacitance of the second capacitive circuit includes decreasing a low band bandwidth.

10. A band switchable voltage controlled oscillator, comprising:

a switchable variable capacitance circuit;

a switchable fixed capacitance circuit coupled to the switchable variable capacitance circuit;

a controller for selectively switching said switchable fixed and variable capacitance circuits;

a fixed tank capacitance circuit coupled to the switchable fixed capacitance circuit;

a main tuning voltage variable capacitance circuit coupled to the fixed tank capacitance circuit;

a tank inductance coupled to the main tuning voltage variable capacitance circuit; and an amplifier circuit coupled to the tank inductance.

11. The band switchable voltage controlled oscillator of claim 10, the switchable variable capacitance circuit comprising a first voltage variable capacitance in series with a first fixed capacitance.

12. The band switchable voltage controlled oscillator of claim 11, the first voltage variable capacitance being coupled to a tuning voltage.

13. The band switchable voltage controlled oscillator of claim 10, the switchable variable capacitance circuit being coupled to a first band shift voltage produced by said controller.

14. The band switchable voltage controlled oscillator of claim 10, the switchable fixed capacitance circuit comprising a fixed capacitance in series with a first voltage variable capacitance.

15. The band switchable voltage controlled oscillator of claim 10, the switchable fixed capacitance circuit being coupled to a second band shift voltage produced by said controller.

16. The band switchable voltage controlled oscillator of claim 10, further comprising a second switchable variable capacitance circuit coupled to a second switchable fixed capacitance circuit.

17. The band switchable voltage controlled oscillator of claim 10, a ratio of total fixed capacitance and total variable capacitance in said switchable variable capacitance circuit, said switchable fixed capacitance circuit, said fixed tank capacitance circuit, and said main tuning voltage variable capacitance circuit, being substantially constant regardless of a state of said controller.

* * * * *